United States Patent
Otremba et al.

(10) Patent No.: US 7,629,676 B2
(45) Date of Patent: Dec. 8, 2009

(54) SEMICONDUCTOR COMPONENT HAVING A SEMICONDUCTOR DIE AND A LEADFRAME

(75) Inventors: Ralf Otremba, Kaufbeuren (DE); Xaver Schloegel, Sachsenskam (DE); Juergen Schredl, Mering (DE)

(73) Assignee: Infineon Technologies AG, Munich (DE)

( * ) Notice: Subject to any disclaimer, the term of this patent is extended or adjusted under 35 U.S.C. 154(b) by 92 days.

(21) Appl. No.: 11/470,750

(22) Filed: Sep. 7, 2006

(65) Prior Publication Data

US 2008/0061413 A1 Mar. 13, 2008

(51) Int. Cl.
*H01L 23/495* (2006.01)
(52) U.S. Cl. .................. 257/676; 257/666; 257/672; 257/E23.066; 438/121; 438/123
(58) Field of Classification Search ........... 257/670, 257/666, 676; 438/121–124
See application file for complete search history.

(56) References Cited

U.S. PATENT DOCUMENTS

| | | | |
|---|---|---|---|
| 5,807,776 A | 9/1998 | Tang | 438/253 |
| 6,479,327 B2 | 11/2002 | Takahashi et al. | 438/124 |
| 6,696,749 B1 * | 2/2004 | Hung et al. | 257/669 |
| 2003/0104658 A1 | 6/2003 | Furukawa et al. | 438/151 |
| 2007/0161151 A1 * | 7/2007 | Madrid et al. | 438/106 |

FOREIGN PATENT DOCUMENTS

JP 60047458 3/1985
WO 02/091463 11/2002

OTHER PUBLICATIONS

PCT International Search Report application No. SE 0400504-7 filed Mar. 2, 2004, 4 pages, Mailed Oct. 13, 2004.
Jin Cai et al., "Vertical SiGe-Base Bipolar Transistors on CMOS-Compatible SOI Substrate", Bipolar/BiCMOS Circuits and Techology Meeting, 2003, pp. 215-218, Published Sep. 2003.
K. Klose et al., "B6HF: A 0.8 Micron 25GHz/25ps Bipolar Technology for "Mobile Radio" and "Ultra Fast Data Link" IC-Products", IEEE 1993 Bipolar Circuits and Technology Meeting 8.1, pp. 125-127, 1993.

* cited by examiner

*Primary Examiner*—Thinh T Nguyen
(74) *Attorney, Agent, or Firm*—Banner & Witcoff, Ltd.

(57) ABSTRACT

A semiconductor component has a leadframe, a semiconductor die and an encapsulation element. The leadframe has a die pad having a first side, at least one lead spaced at a distance from the die pad and at least one support bar remnant protruding from the die pad, each having a distal end. The encapsulation element has plastic and encapsulates at least the semiconductor die and a portion of the first side of the die pad. At least one support bar remnant is positioned within the encapsulation element and the distal end of the support bar remnant is encapsulated by at least one dielectric compound.

14 Claims, 5 Drawing Sheets

SEMICONDUCTOR COMPONENT HAVING A SEMICONDUCTOR DIE AND A LEADFRAME

TECHNICAL FIELD

The application relates to a semiconductor component having a semiconductor die and a leadframe.

BACKGROUND

Semiconductor dies may be provided to a user in the form of a semiconductor package. A semiconductor package may include a plastic encapsulation element providing a housing and package contacts such as pins. The semiconductor die is normally encapsulated within the plastic encapsulation to protect it from environmental as well as mechanical damage. The package is also provided with an electrically conductive wiring structure such as a leadframe or a rewiring substrate in order to enable the semiconductor die to be electrically accessed from outside of the package encapsulation.

A general desire is to increase the performance of semiconductor components. The performance of a packaged semiconductor component may be increased by reducing the size of the package while maintaining the same semiconductor die or by increasing the performance of the semiconductor die accommodated within a package of a given size or by a combination of both measures, for example.

For these and other reasons, there is a need for the present invention as set forth in the following embodiments.

SUMMARY

In an embodiment, a semiconductor component comprises a leadframe, a semiconductor die and an encapsulation element. The leadframe comprises a die pad, the die pad comprising a first side and a second side opposing the first side, at least one lead spaced at a distance from the die pad and at least one support bar remnant protruding from the die pad, the support bar remnant having a distal end. The semiconductor die is mounted on the first side of the die pad. The encapsulation element comprises plastic and encapsulates at least the semiconductor die and a portion of the first side of the die pad. The support bar remnant is positioned within the encapsulation element and the distal end of the support bar remnant is encapsulated by at least one dielectric compound.

BRIEF DESCRIPTION OF THE DRAWINGS

FIGS. 2 to 4 illustrate stages in the production of the semiconductor component of FIG. 1.

DETAILED DESCRIPTION

In an embodiment, a method to increase the creepage distance between two load contacts of a semiconductor component comprising a semiconductor die comprises providing a semiconductor component. The semiconductor component comprises a leadframe, a semiconductor die and an encapsulation element. The leadframe comprises at least one die pad providing a first load contact, at least one lead spaced at a distance from the die pad and at least one support bar protruding from the die pad. At least one lead provides a second load contact. The semiconductor die is mounted on the first side of the die pad. The encapsulation element comprises plastic and encapsulates at least the semiconductor die and a portion of the first surface of the die pad. The support bar protrudes from the encapsulation element. A portion of at least one support bar is removed to form a support bar remnant positioned within the encapsulation element. A surface of the support bar remnant forms a surface of a package cavity within the encapsulation element. At least one dielectric compound is inserted into the package cavity.

In an embodiment, a method of manufacturing a semiconductor component comprises providing a leadframe comprising at least one die pad, at least one lead spaced at a distance from the die pad and at least one support bar protruding from the die pad. The die pad comprises a first side and a second side, the second side opposing the first side. A semiconductor die is provided which comprises a first load electrode and a second load electrode. The semiconductor die is mounted on the first side of the die pad and the first load electrode of semiconductor die is electrically connected to the die pad. The second load electrode of the semiconductor die is electrically connected to a lead of the leadframe. The leadframe and the semiconductor die are placed in a mold comprising a body comprising a mold cavity for providing an encapsulation element of the semiconductor component. Portions of the leads of the leadframe and of the support bar are clamped by the body of the mold and remain outside of the cavity. Plastic encapsulation compound is dispensed into the cavity, substantially filling the mold cavity to provide an encapsulation element and encapsulating at least the semiconductor die and a portion of the first side of the die pad. The mold is removed. A portion of the support bar is removed to form a support bar remnant positioned within the encapsulation element. A surface of the support bar remnant forms a surface of a package cavity within the encapsulation element. A dielectric compound is inserted into the package cavity.

In an embodiment, a semiconductor component comprises a leadframe, a semiconductor die and an encapsulation element. The leadframe comprises a die pad, the die pad comprising a first side and a second side opposing the first side, at least one lead spaced at a distance from the die pad and at least one support bar remnant protruding from the die pad which has a distal end. The semiconductor die is mounted on the first side of the die pad. The encapsulation element comprises plastic and encapsulates at least the semiconductor die and a portion of the first side of the die pad. The support bar remnant is positioned within the encapsulation element and the distal end of the support bar remnant is encapsulated by at least one dielectric compound.

Support bar is used to denote a portion of the leadframe which extends from the die pad and which provides mechanical support for the die pad during the mold process to form the encapsulation element of the semiconductor component. The encapsulation element provides a package housing and may comprise a dielectric such as epoxy resin or any other kind of organic dielectric compound. A portion of the support bar is clamped by the mold during the mold process and remains outside of the encapsulation element of the semiconductor component.

The leadframe of a single semiconductor component may comprise one or more support bars which link the leadframe to further leadframes of a leadframe strip during the manufacturing process. One or more support bars may extend from the die pad, each having a distal end which extends into a further support bar of the leadframe strip. In an embodiment, one or more support bars may also extend between two adjacently positioned die pads of a leadframe strip. In this embodiment, the central portion of the support bar remains unencapsulated by the encapsulation element of each of the two adjacently positioned semiconductor components.

Support bar remnant is used to denote the portion of a support bar which remains protruding from the die pad after an outer portion of the support bar is removed. The support bar remnant has a distal end which is positioned within the encapsulation element. The distal end of the support bar remnant is encapsulated by at least one dielectric compound. The die pad from which the support bar remnant protrudes is not electrically accessible via the distal end of the support bar remnant from outside of the encapsulation element since the distal end of the support bar remnant is encapsulated by at least one dielectric compound.

The creepage distance is the shortest path between two conductive parts measured along the surface of the encapsulation element which provides electrical isolation. A proper and adequate creepage distance protects against tracking, a process that produces a partially conducting path of localized deterioration on the surface of an insulating material as a result of the electric discharges on or close to an insulation surface. By increasing the creepage distance between the two conductive parts the working voltage and, for a component comprising a transistor, the blocking voltage is increased.

The support bar remnant fails to provide a portion of the outer surface of the encapsulation element or of the semiconductor component. The encapsulation of the support bar remnant by at least one dielectric compound may be used to increase the creepage distance between two electrically conductive parts of the semiconductor component which are exposed from the encapsulation element. For example, the creepage distance between the second side of the die pad and a lead of the leadframe may be increased by selectively removing the outer portion of one or more support bars and encapsulation the exposed distal end of the resulting support bar remnant in a dielectric compound. Thus, the blocking voltage of the component may be increased without increasing the size of the component.

In an embodiment, the portion of the support bar remnant not encapsulated by at least one dielectric compound is encapsulated by the encapsulation element.

The dielectric compound encapsulating the distal end of the support bar remnant may comprise substantially the same compound as the encapsulation element. In a further embodiment, the dielectric compound encapsulating distal end of the support bar remnant comprises a different composition to that of the encapsulation element.

In an embodiment, the support bar remnant forms a surface of a cavity within the encapsulation element. The cavity is substantially filled with the at least one dielectric compound. The distal end may provide a surface of the cavity or, in an embodiment, a surface of the support bar remnant which lies substantially perpendicular to the length of the support bar remnant provides a surface of the cavity. The remaining surfaces of the cavity may be provided by surfaces of the encapsulation element.

In an embodiment, the dielectric compound substantially filling the cavity in the encapsulation element comprises an epoxy resin and in an embodiment, comprises ceramic particles embedded in an epoxy resin.

In an embodiment, two leads are positioned adjacent a first side edge of the die pad and at least one support bar remnant is positioned between the two leads such that the support bar remnant may be positioned at any location between the two leads.

Side edge is used to denote an edge of the die pad which is the surface positioned substantially perpendicular to the first side and the second side of the die pad.

In an embodiment, the support bar remnant protrudes from the first side edge of the die pad and two leads are positioned adjacent the first side edge of the die pad. The distal end of the sport bar remnant may lie closer to the first side edge of die pad than the innermost end of the two leads.

In an embodiment, the leads are positioned adjacent a first side edge of the die pad and at least one support bar remnant protrudes from a second side edge of the die pad. The second side edge of the die pad is substantially perpendicular to the first side edge. The leads of the leadframe of the semiconductor component are, therefore, positioned substantially perpendicular to the at least one support bar remnant. In this embodiment, the at least one support bar remnant may be the remaining portion of a support bar which extended between two adjacently situated die pads of a leadframe strip. In an embodiment, a support bar remnant extends from each of the two second side edges of the die pad and two leads are provided adjacent to the first side edge.

In an embodiment, the leadframe provides outer contact areas of the semiconductor component having a defined layout. Each electrically conductive surface of the leadframe protruding from the encapsulation element provides an outer contact area of the defined layout. In this embodiment, all of the support bars provided in the original leadframe have been removed so as to provide support bar remnants positioned within the encapsulation element and each of the distal ends of the support bar remnants is encapsulated by at least one dielectric compound.

In an embodiment, the leadframe provides outer contact areas and the semiconductor die comprises a first load electrode and a second load electrode. The first load electrode is electrically connected to a first outer contact area and the second load electrode is electrically connected to a second outer contact area. The blocking voltage between the first outer contact area and the second outer contact area is at least 1000V as a result, at least in part, of the dielectric compound encapsulating the distal end of the support bar remnant.

The first outer contact area and the second outer contact area are provided by portions of the leadframe which are exposed from the encapsulation element. The first outer contact area may be a surface of the die pad or a lead and the second outer contact area may be a surface of the die pad or a lead.

In an embodiment, the first outer contact area is the second side of the die pad and the second outer contact area is a lead. In an embodiment, first outer contact area is a lead and the second outer contact area is the second side of the die pad. In both embodiments, the blocking voltage between the second side of the die pad and the lead providing the second outer contact area is at least 1000 volts as a result, at least in part, of the dielectric compound encapsulating the distal end of the support bar remnant.

In an embodiment, the semiconductor component comprises a TO 252 package and comprises a blocking voltage between the second side of the die pad, which is exposed, and not encapsulated by, the encapsulation element, and the load lead of at least 1000 volts as a result, at least in part, of the dielectric compound encapsulating the distal end of the support bar remnant.

In an embodiment, the semiconductor component comprises a TO 252 package and comprises a creepage distance between the second side of the die pad which is exposed, and not encapsulated by, the encapsulation element and the load lead of at least 2 mm (millimeters), preferably, at least 3 mm.

In an embodiment, the semiconductor die is a semiconductor power device and, in an embodiment, the semiconductor die is one of a power MOSFET (Metal Oxide Semiconductor Field Effect Transistor), a power IGBT (Isolated Gate Bipolar Transistor), a power BJT (Bipolar Junction Transistor) and a diode.

In an embodiment, a semiconductor component comprises a leadframe, a semiconductor power transistor device and an encapsulation element. The leadframe comprises a die pad, the die pad comprising a first side and a second side opposing the first side, at least one load lead and at least one control lead spaced at a distance from the die pad and at least one support bar remnant protruding from the die pad. The semiconductor power transistor device is mounted on the first side of the die pad and comprises a first load electrode, a second load electrode and a control electrode. The first load electrode is electrically connected to the die pad, the second load electrode is electrically connected to the load lead and the control electrode is electrically connected to the control lead. The encapsulation element comprises plastic and encapsulates at least the semiconductor power transistor and a portion of the first side of the die pad. At least portions of each of the second side of the die pad, the control lead and the load lead are exposed from the encapsulation element. At least one support bar remnant is positioned within the encapsulation element and is encapsulated by at least one dielectric compound.

The support bar remnant is positioned within the encapsulated element and is encapsulated by at least one dielectric compound. The at least one support bar remnant is not positioned on an outer surface of the encapsulation element of the semiconductor component. Consequently, the possibility of current creepage between the support bar remnant and the load lead is reduced and may be substantially eliminated.

Consequently, the creepage distance between the die pad which provides the first load contact and the second load lead may be increased without increasing the size of the housing or the layout of the leadframe or the leadframe strip. The semiconductor component may then be fabricated using a standard leadframe strip and the creepage distance between two electrically conductive surfaces, such as the two load contacts provided by the die pad and a lead, may be increased by selectively removing the outer portions of selected support bars and providing support bar remnants encapsulated by dielectric compounds. The semiconductor component may be provided with a higher blocking voltage than that achievable when the distal end of this support bar is positioned at the surface of the encapsulation element. The semiconductor power device may be a MOSFET, IGBT or a BJT.

In an embodiment, each of the support bar remnants protruding from the die pad has a distal end and each distal end is encapsulated by at least one dielectric compound. As previously described, the dielectric compound encapsulating the distal end of the support bar remnant may comprise a composition substantially the same as the composition of the encapsulation element or may comprise a composition which is different to that of the encapsulation element.

In an embodiment, the creepage distance between the load lead and the die pad is greater than the creepage distance between the load lead and the control lead as a result, at least in part, of the dielectric compound encapsulating the distal end of the support bar remnant.

In an embodiment, the blocking voltage between the die pad and the load lead is at least 1000 volts as a result, at least in part, of the dielectric compound encapsulating the distal end of the support bar remnant.

The application also provides a method to increase the creepage distance between two load contacts of a semiconductor component comprising a semiconductor die.

A semiconductor component is provided which comprises a leadframe, a semiconductor die and an encapsulation element. The leadframe comprises at least one die pad providing a first load contact, at least one lead spaced at a distance from the die pad and at least one support bar protruding from the die pad. At least one lead provides a second load contact. The semiconductor die is mounted on the die pad. The encapsulation element comprises plastic and encapsulates at least the semiconductor die and a portion of the first surface of the die pad.

The at least one support bar protrudes from the encapsulation element. A portion of at least one support bar is removed to form a support bar remnant positioned within the encapsulation element. A surface of the support bar remnant forms a surface of a package cavity within the encapsulation element. At least one dielectric compound is inserted into the package cavity.

The distal end of the support bar remnant is positioned within the package cavity positioned within the encapsulation element. The package cavity comprises the least one dielectric compound which may encapsulate the surface or surfaces of the support bar remnant providing a surface of the package cavity. Consequently, the support bar remnant is not positioned in the outer surface of the encapsulation element of the semiconductor component and is embedded in dielectric material of the encapsulation element and dielectric compound of the package cavity. Consequently, current creepage between the distal end of the support bar remnant and the second load contact is reduced, and may be substantially eliminated, as a result of the encapsulation of the distal end of the support bar remnant by the dielectric compound. Consequently, the creepage distance between the die pad, which provides the first load contact, and the lead which provides the second load contact of the semiconductor component may be increased by the removal of the outer portion of selected support bars.

The method may be used to increase the creepage distance between the two load contacts of a semiconductor component which is fabricated using the existing manufacturing line, since the manufacturing line may be modified only at the point at which the support bars are cut to separate the individual semiconductor components from leadframe strip, for example. Rather than cutting the support bar flush with the outer surface of the encapsulation element, the outermost portion of the support bar is removed to leave the distal end of the support bar remnant positioned within the encapsulation element. Thus, a package cavity is formed within the encapsulation element due to the removal of this portion of the support bar. The package cavity has a size roughly corresponding to the size of the portion of the support bar previously encapsulated in the encapsulation element and now removed. Dielectric compound is inserted into this package cavity and may completely encapsulate the distal end of the support bar remnant.

The support bar no longer provides an electrically conductive area of the outer surface of the encapsulation element. The creepage distance between two further electrically conductive surfaces which protrude from the encapsulation element, such as a load lead and the die pad, may be increased by removing the outer portion of one or more selected support bars and embedding the distal end of the support bar remnant formed in a dielectric compound.

In an embodiment, the package cavity is substantially filled with the dielectric compound which, in an embodiment, is an epoxy resin. An increased thickness of the dielectric layer encapsulating the distal end of the support bar remnant further increases the electrical isolation of the distal end and may further increase the blocking voltage between the two load contacts.

In an embodiment, the support bar of the semiconductor component extends from a first side edge of the die pad and the leads of the leadframe are positioned adjacent the first side edge of the die pad. The support bar is positioned directly between the two leads of leadframe.

The support bar may, in this embodiment, provide a second first load contact when it protrudes from the encapsulation element as is known from the TO252-3 package for example. In order to increase the creepage distance between the two load contacts, the outermost portion of the support bar is removed to form a support bar remnant positioned within the encapsulation element. The package cavity formed by the removal of the outermost portion is substantially filled with dielectric compound.

Consequently, only the exposed lower surface of the die pad provides a first load contact and the creepage distance between the second load contact provided by a lead and the first load contact is increased as the creepage distance is now the distance between the lower surface of the die pad and the lead rather than between the support bar and the lead.

If the semiconductor component conforms to a TO252 package standard, the method can result in an increase of the creepage distance between the lower surface of the die pad and the load lead from around 1.5 mm to around 3 mm. The blocking voltage between the first load contact and second load contact may be correspondingly increased from around 600 volts to around 1000 volts.

In an embodiment, a predetermined breaking region is provided in the support bar. The predetermined breaking region is positioned in a region of the support bar which is positioned within the encapsulation element. The predetermined breaking region may be provided in the form of a constriction in the width and/or a constriction in the thickness of a defined region of the support bar. The predetermined breaking region may also be provided as a predetermined breaking point.

In an embodiment, the support bar is broken at the predetermined breaking region to remove the outer portion of the support bar and to form the support bar remnant positioned within the encapsulated element of the semiconductor component.

In an embodiment, the semiconductor die is a power transistor which comprises a first load electrode and a second load electrode. The first load electrode of the power transistor is electrically connected to the die pad and the second load electrode of the power transistor is electrically connected to a lead of the leadframe. This lead provides the second load contact of the semiconductor component.

The application also provides a method of manufacturing a semiconductor component. A leadframe is provided which comprises at least one die pad, at least one lead spaced at a distance from the die pad and at least one support bar protruding from the die pad. The die pad comprises a first side and a second side, the second side opposing the first side.

A semiconductor die is provided which comprises a first load electrode and a second load electrode. The semiconductor die is mounted on the first side of the die pad and the first load electrode of semiconductor die is electrically connected to the die pad. The second load electrode of the semiconductor die is electrically connected to a lead of the leadframe.

The leadframe and the semiconductor die are placed in a mold comprising a body and a mold cavity for providing an encapsulation element of the semiconductor component. Portions of the leads of the leadframe and of the support bar are clamped by the body of the mold and remain outside of the cavity.

Plastic encapsulation compound is dispensed into the cavity, substantially filling the mold cavity to provide an encapsulation element and encapsulate at least the semiconductor die and a portion of the first side of the die pad. The mold is removed.

A portion of the support bar is removed to form a support bar remnant positioned within the encapsulation element. A surface of the support bar remnant forms a surface of a package cavity within the encapsulation element. A dielectric compound is inserted into the package cavity.

The outer portion of one or more selected support bars may be removed to provide a support bar remnant in order to increase the creepage distance between two further electrically conductive surfaces of the semiconductor component, such as the first load contact and the second load contact.

As in the method to increase the creepage distance of the semiconductor component, the dielectric compound may substantially fill the package cavity and may comprise an epoxy resin.

In an embodiment, a predetermined breaking region is provided in the support bar. The predetermined breaking region is positioned in the support bar in a position within the encapsulation element. In an embodiment, the support bar is severed at the predetermined breaking region in order to remove the outer portion of the support bar from the semiconductor component and to form a support bar remnant positioned within the encapsulation element. At least a surface of the support bar remnant forms a surface of the package cavity within the encapsulation element. This surface is encapsulated by the dielectric compound inserted into the package cavity. The semiconductor die of the semiconductor component may be a power MOSFET, a power IGBT or power BJT.

The application provides a semiconductor component comprising a support bar remnant within the encapsulation element of the semiconductor component. The distal end of the support bar remnant is encapsulated by at least one dielectric compound so that the support bar remnant no longer provides an electrically conductive surface positioned in the outer surface of the encapsulation element. Therefore, current creepage or tracking between the support bar and physically separate electrically conductive surfaces in the electrically insulating encapsulation element is reduced and may be substantially eliminated. Consequently, the creepage distance between the die pad of the component and a second load lead of the component is increased enabling the blocking voltage of the component to be increased without increasing the size of the component. This may be simply and cost-effectively achieved by removing the outermost portion of one or more support bars after the mold process of an existing manufacturing line. Thus a component with increased blocking voltage may be provided at a low cost.

Figure 1:
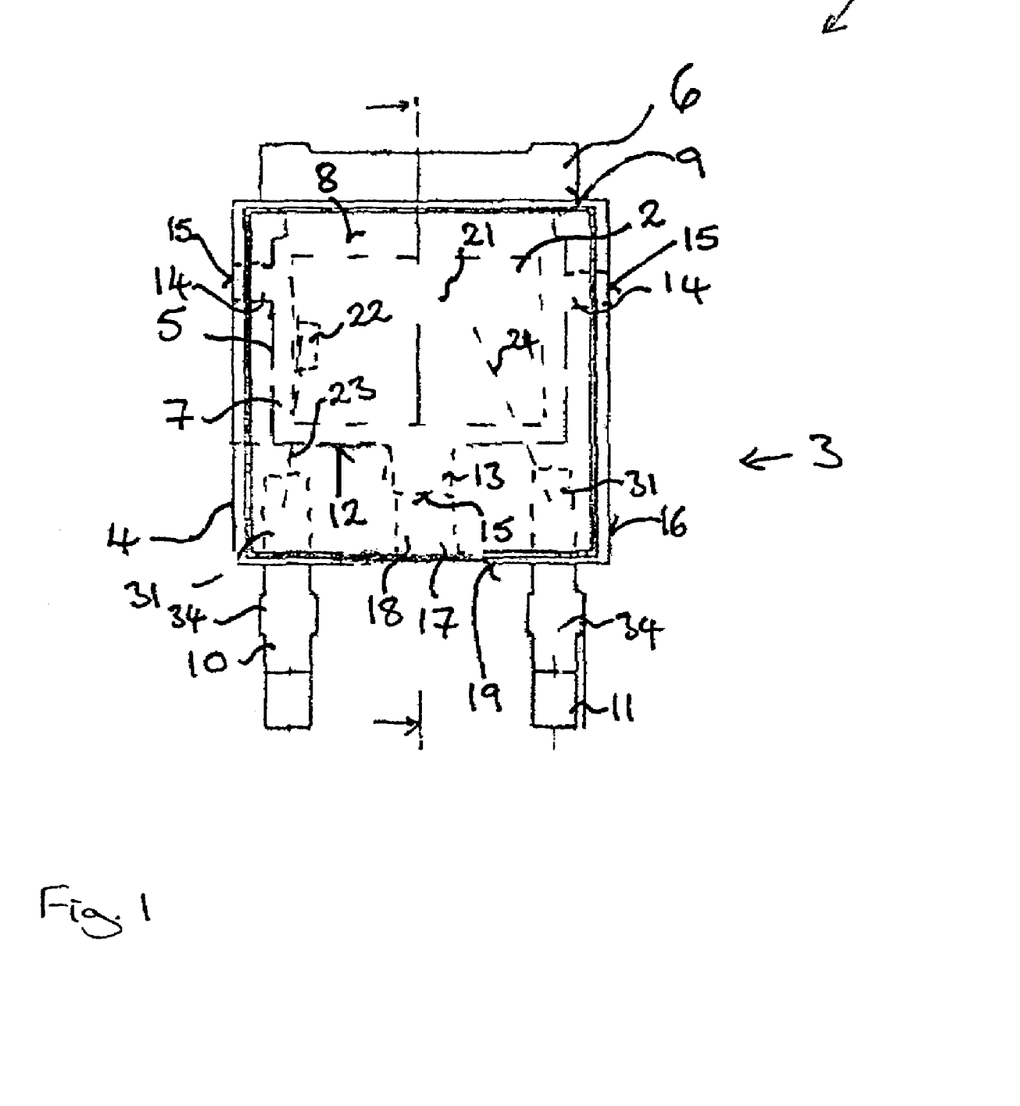
FIG. 1 illustrates a top view of a semiconductor component according to a first embodiment.

FIG. 1 illustrates a top view of a semiconductor component 1 according to a first embodiment. The semiconductor component 1 is based on the known TO252-3 package type.

The semiconductor component 1 comprises a vertical power MOSFET transistor 2, a leadframe 3 and an encapsulation element 4 comprising an epoxy resin which provides the package housing. The leadframe 3 comprises a die pad 5.

The die pad 5 has a die attach area 7 which is positioned inside the plastic encapsulation element 4 and which is substantially laterally rectangular. The MOSFET device 2 is mounted on the upper surface 8 of the die pad 5 in the die attach region 7. As can be seen in the cross-sectional views of FIGS. 2 to 4, the drain contact is positioned on the lower surface of the MOSFET device 2 and is mounted on, and electrically connected to, the upper side 8 of the die pad 5. The die pad 5 extends from a first long side 9 of the die attach region 7 outside of the encapsulation element 4 to provide a heat sink area 6.

The leadframe 3 further comprises two leads 10, 11 which are positioned adjacent the second long side 12 of the die pad 5, the second long side being positioned approximately parallel to the first long side 9 of the die pad 5. The two leads 10, 11 are spaced at a distance from the second long side 12 of the die pad 5 and are not in physical contact the die pad 5. The portions of the leads 10, 11 adjacent the die pad 5 are positioned inside the encapsulation element 4. Each lead extends in directions approximately perpendicular to the long side 12 of the die pad 5 and extends outside of the plastic encapsulation element 4 to provide an external contact of the semiconductor component 1. The leadframe 3 of the semiconductor component 1 also comprises a support bar remnant 13 and two support bars 14 which each extend from the die pad 5.

A support bar 14 extends from each of the short sides of the die pad 5 in the direction approximately perpendicular to the short side of the die pad 5. The support bars 14 extend so that the distal end 15 of the support bar 14 is substantially coplanar with the outer surface 16 of the encapsulation element 4. Each of the support bars 14 originally extended between the die pad 5 and a second die pad positioned adjacently in a leadframe strip. The support bars 14 are clamped by the mold during the molding process so as to fix the position of the die pad 5 in the mold cavity during the encapsulation or mold process.

The leadframe 3 also comprises a support bar remnant 13. In this embodiment, the support bar remnant 13 extends from the second long side 12 of the die pad f5 and is positioned in approximately the centre of the long side 12. The support bar remnant 13 is positioned between the two leads 10, 11 of the leadframe 3.

In contrast to the support bars 14, the distal end 15 of the support bar remnant 13 is positioned within the plastic encapsulation element 4 which provides the package housing. The plastic encapsulation element 4 further comprises a package cavity 17 which extends from the distal end 15 of the support bar remnant 13 to the outer surface 16 of the encapsulation element 4. The cavity 17 has a height and a width which approximately corresponds to the height and width of the support bar remnant 13. In the first embodiment, the package cavity 17 is substantially filled with a dielectric compound 18 of an epoxy resin.

In contrast to some conventional TO252 type packages, the semiconductor component 1 provides only two leads 10, 11 which protrude from the side face 19 of the encapsulation element 4 rather than three leads and at the same time has only one support bar protruding from each of the short sides of the die pad 5.

As previously described, the drain contact positioned on the lower surface of the MOSFET device 2 is electrically connected to the die pad 5 and can be electrically accessed from outside of the encapsulation element 4 by the lower surface 20 of the die pad 5 which remains uncovered by the encapsulation element 4.

The source electrode 21 and gate electrode 22 of the MOSFET device 2 are positioned on the upper surface of the MOSFET device 2. The gate electrode 22 is electrically connected to the first lead 10 by a bond wire 23 and the source electrode 21 is electrically connected by a bond wire 24 to the second lead 11.

The semiconductor component 1 has an increased creepage distance between the two load contacts provided by lead 11, which is denoted as the source lead as it as it is electrically connected to the source electrode 21 of the MOSFET device 2, and the drain contact of the semiconductor device 1 since the shortest distance between the lead 11 and the drain contact is the shortest distance between the lead 11 and the lower surface 20 of the die pad 5.

In a conventional TO252-3 package, the creepage distance between the source lead 11 and the drain contact is the distance between the lead 11 and the support bar 13 which in a conventional TO252-3 package extends from the die pad 5 outside of the encapsulation element 4 and is positioned adjacent the source lead 11. Since, in the semiconductor component 1, the outermost portion of the support bar 13 has been removed creating the cavity 17 and, since the cavity 17 has been substantially filled with a dielectric compound 18, the creepage distance between the drain contact and the source lead 11 has been increased. The increased creepage distance provides the semiconductor component 1 with an increased blocking voltage.

In the embodiment of FIG. 1, in which the semiconductor component 1 is based on a TO252 package, the creepage distance between the drain contact 5 provided by the lower surface 20 of the die pad 5 and the source lead 11 has been increased from around 1.5 mm to around 3 mm which increases the blocking voltage from around 600 V to around 1000 V.

In a further embodiment, not shown in the figures, the outermost portions of the two support bars 14 which extend from the short sides of the die pad 5 are also removed to provide support bar remnants positioned within the encapsulation element 4. The cavities 17 formed between the distal end 15 of the support bar remnants and the side face 16 of the encapsulation element 4 are filled with a dielectric compound such as an epoxy resin.

The pinning of the leads depends on the kind of the semiconductor component. For instance, for a MOSFET, lead 10 can be the gate, lead 11 the source and the heat sink area 6 the drain. For an IGBT, lead 10 can be the gate, lead 11 the emitter and the heat sink area 6 the collector. For a diode, leads 10 and 11 can be the anode and the heat sink area 6 the cathode.

Figure 2:
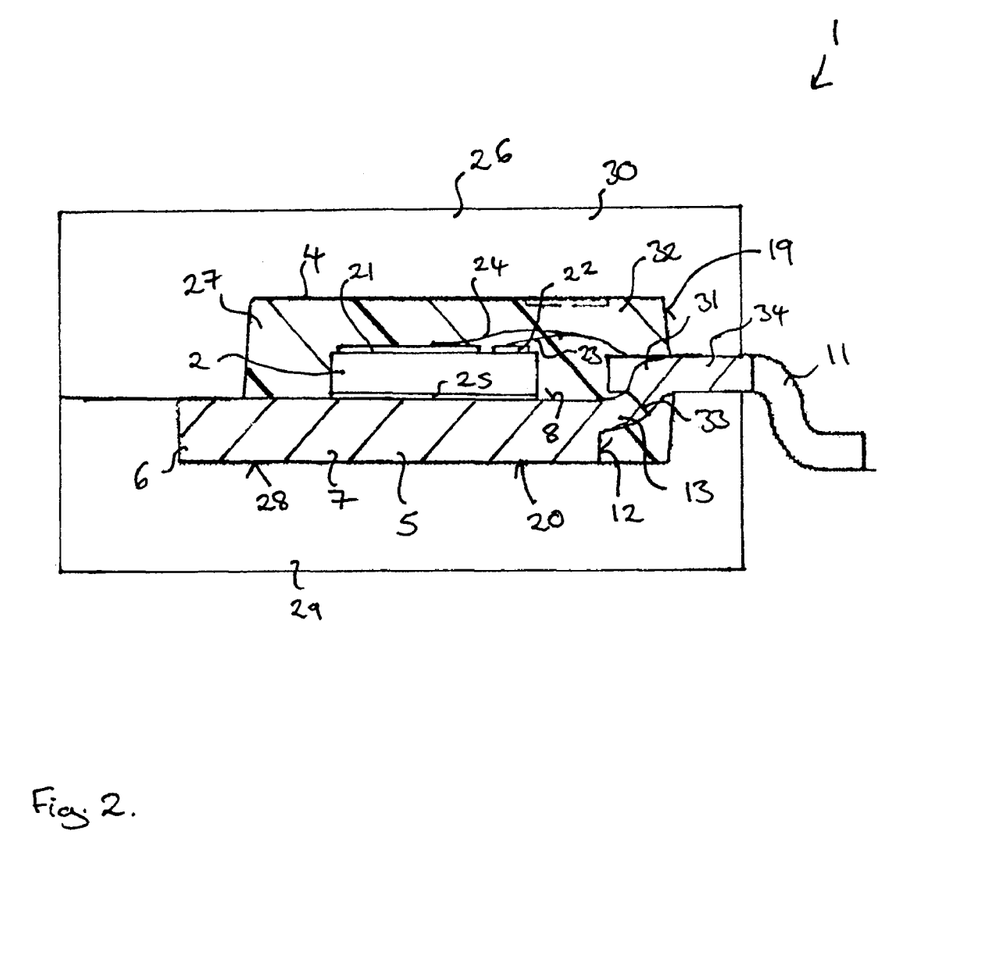
FIG. 2 illustrates a cross-sectional view of the encapsulation process.
Figure 3:
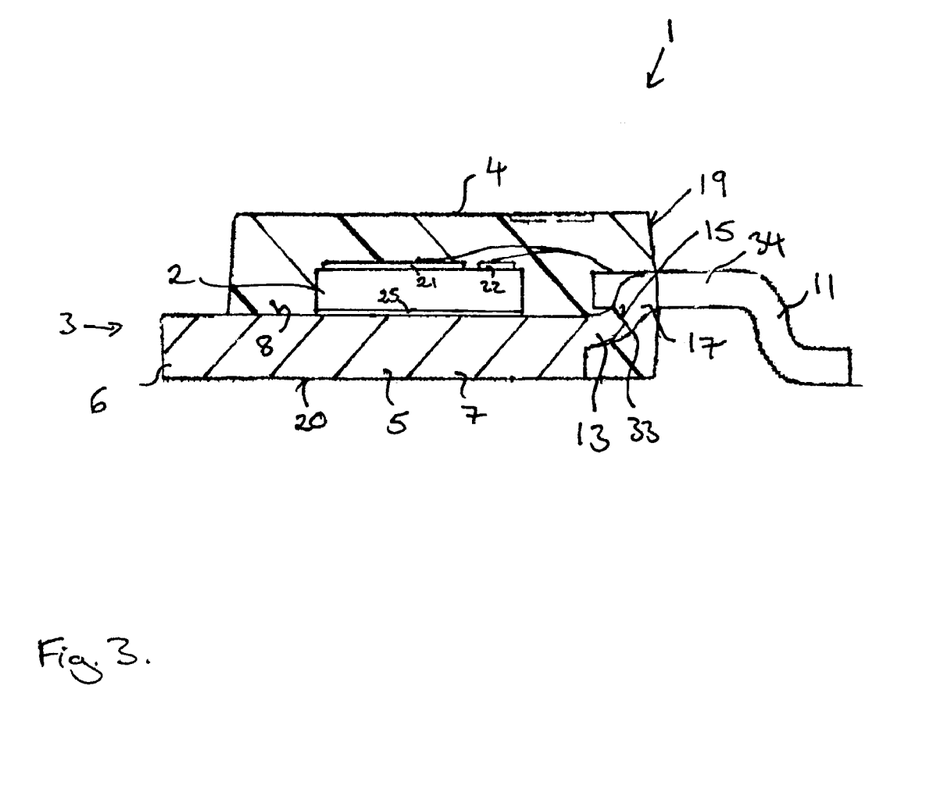
FIG. 3 illustrates the removal of a support bar of the encapsulated semiconductor component of FIG. 2.
Figure 4:
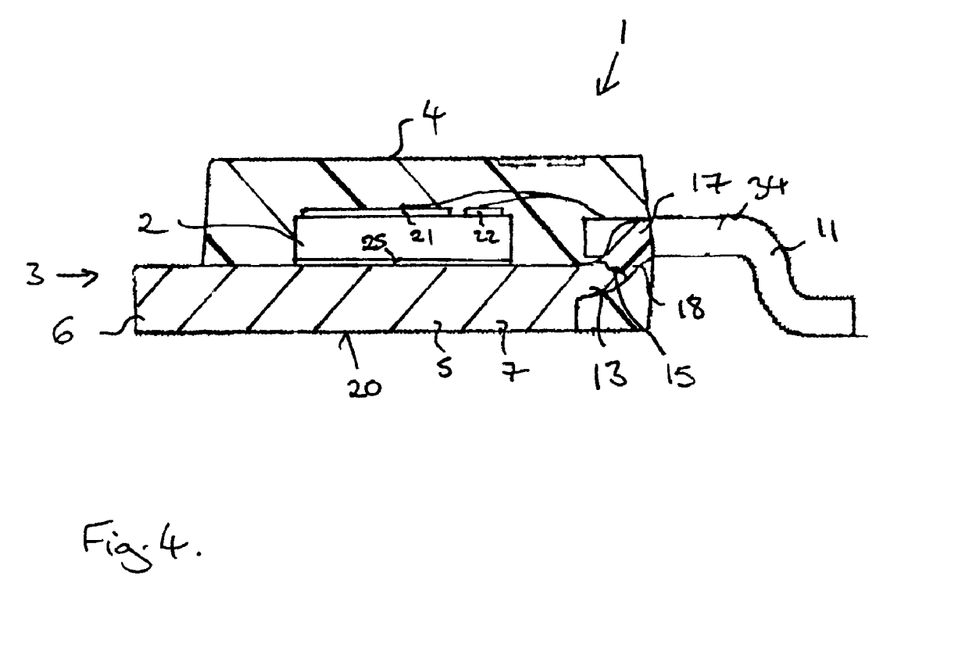
FIG. 4 illustrates a cross-sectional view of the semiconductor component of FIG. 1 in which the package cavity has been filled with a dielectric compound.

FIGS. 2 to 4 illustrate a method by which the semiconductor component 1 may be produced. FIG. 2 illustrates a cross-sectional side view of the semiconductor component 1 of FIG. 1 during the molding process.

At this stage of the production process, the MOSFET device 2 has been mounted on the upper surface 8 of the die attach region 7 of the die pad 5. The drain contact 25 positioned on the lower surface of the MOSFET device 2 is mounted on, and electrically connected to, the upper surface 8 of the die pad 5. The source electrode 21 has been electrically connected to the source lead 11 by bond wire 24 and the gate electrode 22 has been electrically connected to the gate lead 10 by bond wire 23.

The leadframe 3 with the MOSFET device 2 has been placed in a mold 26 having a cavity 27. The cavity 27 provided by the first portion 29 and second portion 30 of the mold 26 is positioned at a distance around the MOSFET device 2, bond wires 23, 24 and innermost portions 31 of the leads 10, 11, 13 of the leadframe 3. The lower surface 20 of the die pad 5 is in contact with the lower surface 28 of first portion 29 of the mold 26 so that the lower surface 20 of the die pad 5 is not encapsulated by the encapsulation compound during the mold process.

As can be seen in FIG. 1, the support bar 13 extends form the second long edge 12 of the die pad 5 and has a length which is sufficient so that a portion of the support bar 13 is clamped between the two portions 29, 30 of the mold 26. The center portions of the two further leads 10, 11 of the leadframe 3 are also clamped between the two portions 29, 30 of the mold 26 so that only the inner most portions 31 of the three leads are positioned within the mold cavity 27. The support bars 14 which extends from the short sides of the die pad 5 are not illustrated in the cross-sectional view of FIG. 2. Portions of the support bars 14 are also clamped between the two portions 29, 30 of the mold 26.

The mold cavity 27 is then filled with epoxy resin 32 which encapsulates the MOSFET device 2, bond wires 23, 24, inner portions 11 of the leads 11, 12, 13 and a portion of the upper surface 8 of the die pad 5 and forms the plastic encapsulation element 4.

The support bar 13 which extends form the die pad 5 also includes a predetermined breaking region indicated by a line 33 in FIG. 2. The predetermined breaking region 33 is positioned within the mold cavity 27 and within the encapsulation element 4 of the semiconductor component 1. The predetermined breaking region has the form of a constriction in the width of the support bar 13.

FIG. 3 illustrates a further stage in the method to produce the semiconductor component 1. The semiconductor component 1 including the encapsulation element 4 has been removed from the mold 26. At this stage both the support bar 13 as well as the further support bars 14 and leads 10, 11 extend from the encapsulation element 4. The outermost portion of the support bar 13 has been removed by severing the support bar 13 at the predetermined breaking region 33 to form a support bar remnant 13. A support bar remnant 13 has been provided which is positioned within the encapsulation element 4 and has a distal end 15 also positioned within the encapsulation element 4. Since the outermost portion of the support bar 13 has been removed, a cavity 17 has been formed which extends from the distal end 15 of the support bar remnant 13 to the outer surface 16 of the plastic encapsulation element 4. At least the distal end 15 of the support bar remnant 13 forms a surface of the cavity 17.

FIG. 4 illustrates the semiconductor component 1 in which the cavity 17 formed by the removal of the outermost portion of the support bar 13 has been substantially filled with dielectric compound 18. FIG. 4 illustrates the semiconductor component 1 of FIG. 1 in cross-section. The creepage distance between the source lead 10 and the drain contact provided by the lower surface 20 of the die pad 5 has been increased as a result of the electrical isolation of the distal end 15 of the support bar 13. The distal end 15 of the support bar 13 is positioned within the encapsulation element 4 and is encapsulated by epoxy resin 18. The blocking characteristic of the semiconductor component has also been increased as a result of the increased creepage distance provided by the electrical isolation 18 of the distal end 15 of the support bar remnant 13.

Figure 5:
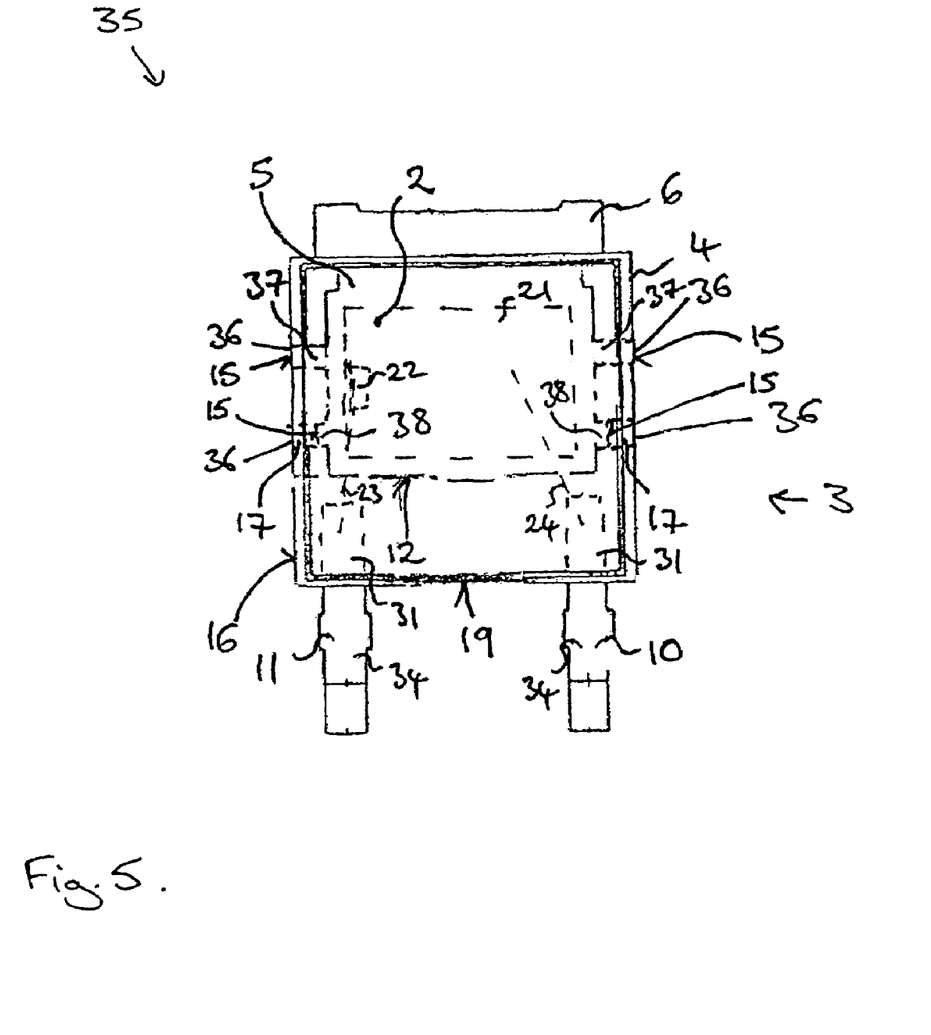
FIG. 5 illustrates a top view of a semiconductor component according to a second embodiment.

FIG. 5 illustrates a top view of a semiconductor component 35 according to a second embodiment. The semiconductor component 35 also comprises a MOSFET device 2, leadframe 3 and encapsulation element 4 substantially as illustrated with reference to the first embodiment.

The semiconductor component 35 of the second embodiment differs form the semiconductor component 1 of the first embodiment in the arrangement of the support bars extending from the die pad 5. In the second embodiment, the semiconductor component 35 comprises four support bars 36. Two support bars 36 are positioned in each of the two short sides of the die pad 5. A first support bar 37 is positioned towards the heat sink 6 and extends form the die pad 5 approximately perpendicularly to the short side of the die pad 5 and extends to the outer surface 16 of the encapsulation element 4. The distal end 15 of the first support bar 37 is positioned so that it is substantially coplanar with the outer surface 16 of the encapsulation element 4.

A second support bar 38 is positioned in each of the short sides spaced at a distance from the first support bar 37 and positioned in the short side near the leads 10, 11. The support bar 38, as can be seen in FIG. 5, is a support bar remnant with a distal end 15 which is positioned within the encapsulation element 4. The region between the distal end 15 of the support bar remnant 38 and the outer surface 16 of the encapsulation element 4 is filled with a dielectric compound 18 as in the first embodiment.

In contrast to the first embodiment, the long side 12 of the die pad 5 does not include a support bar or a support bar remnant. The support for the die pad during the molding process in the second embodiment is provided by the two support bars 37, positioned in each of the two short sides of the die pad 5. The support bars 37, 38 extend between two adjacent die pads of the die pad strip during the encapsulation process.

The provision of the support bar remnants 38 each with a distal end which is electrically isolated from the outer surface 16 of the encapsulation element 4 increases the creepage distance between the source contact 11 and drain contact provided by the die pad 5. The creepage distance can be sufficiently increased for some applications by providing a support bar remnant 38 only in the support bar positions closest to the leads 10, 11 of the leadframe.

In a further embodiment not illustrated in the figures, the outer portion of each of the two first support bars 37 is also removed to provide two first support bar remnants 37 located within the encapsulation element.

The support bar remnant 38 may be fabricated using a similar method as illustrated in FIGS. 2 to 4 for the first embodiment. During the encapsulation process, the centre regions of the support bars 37 and 38 are clamped between the two portions of the mold. After the production of the encapsulation element 4, an intermediate semiconductor component is provided in which the four support bars 36 as well as the two leads 10, 11 extend from the plastic encapsulation element 4.

The outermost portion of the first support bars 37 is removed so that the support bar remaining within the encapsulation element has a distal end which is substantially coplanar with the outer surface 16 of the encapsulation element 4. The outermost portions of the second support bars 38 which are positioned nearer to the leads 10, 11 are then removed to provide second support bar remnants 38 having a distal end 15 positioned within the plastic encapsulation element 4. The removal of the outer portion of the second support bars 38 creates a cavity or indentation in the outer surface 16 of the encapsulation element 4. The distal end 15 of the support bar remnant 38 forms a surface of this cavity. The cavity is then filled with dielectric compound so that the distal end 15 of the support bar remnant 38 does not form an outer surface of the semiconductor component 35.

The creepage distance between the load lead 10 and the load contact provided by the lower surface 20 of the die pad 5 has been increased as a result of forming support bar remnants 38 for each of the second support bars 38 positioned nearer to the leads 10, 11. The increased creepage distance leads to an increased blocking characteristic for the semiconductor component 35.

REFERENCE NUMBERS 1 first semiconductor component
2 MOSFET
3 leadframe
4 encapsulation element
5 die pad
6 heat sink region
7 die attach area
8 upper surface of die pad
9 first long side
10 gate lead
11 source lead
12 second long side of die pad
13 support bar remnant
14 support bar
15 distal end of support bar
16 outer surface of encapsulation element
17 package cavity
18 dielectric compound
19 side face of encapsulation element
20 lower surface of die pad
21 source electrode
22 gate electrode
23 first bond wire
24 second bond wire
25 drain contact
26 mold
27 mold cavity
28 lower surface of first mold portion
29 first mold portion
30 second mold portion
31 inner portions of leads
32 epoxy resin
33 predetermined breaking region
34 centre portion of leads
35 second semiconductor component
36 support bars
37 first support bar
38 second support bar remnant

What is claimed is:

1. A semiconductor component, comprising:
a leadframe comprising a die pad, the die pad comprising a first side and a second side opposing the first side, at least one lead spaced at a distance from the die pad and at least one support bar remnant protruding from the die pad and having a distal end,
a semiconductor die mounted on the die pad,
an encapsulation element comprising plastic, the encapsulation element encapsulating at least the semiconductor die and a portion of the first side of the die pad,
wherein the support bar remnant is positioned within the encapsulation element and the distal end of the support bar remnant is encapsulated by at least one dielectric compound.

2. A semiconductor component according to claim 1, wherein the support bar remnant forms a surface of a cavity within the encapsulation element, the cavity being substantially filled with the at least one dielectric compound.

3. A semiconductor component according to claim 2, wherein The dielectric compound comprises an epoxy resin.

4. A semiconductor component according to claim 1, wherein two leads are positioned adjacent a first side edge of the die pad and wherein at least one support bar remnant is positioned between the two leads.

5. A semiconductor component according to claim 1, wherein the leads are positioned adjacent a first side edge of the die pad and at least one support bar remnant protrudes from a second side edge of the die pad, the second side edge of the die pad being substantially perpendicular to the first side edge.

6. A semiconductor component according to claim 1, wherein the leadframe provides outer contact areas of the semiconductor component having a defined layout, wherein each electrically conductive surface of the leadframe protruding from the encapsulation element provides an outer contact area of the defined layout.

7. A semiconductor component according to claim 1, wherein the leadframe provides outer contact areas of the semiconductor component and the semiconductor die comprises a first load electrode and a second load electrode, wherein the first load electrode is electrically connected to a first outer contact area and the second load electrode is electrically connected to a second outer contact area and the blocking voltage between the first outer contact area and the second outer contact area is at least 1000V as a result, at least in part, of the dielectric compound encapsulating the distal end of the support bar remnant.

8. A semiconductor component according to claim 7, wherein the semiconductor component comprises a TO252 package.

9. A semiconductor component according to claim 7, wherein the first outer contact area is the second side of the die pad and the second outer contact area is a lead.

10. A semiconductor component according to claim 7, wherein the semiconductor die is a semiconductor power device.

11. A semiconductor device according to claim 10, wherein the semiconductor die is one of a MOSFET, an IGBT and a BJT.

12. A semiconductor component, comprising
a leadframe comprising a die pad, the die pad comprising a first side and a second side opposing the first side, at least one load lead and at least one control lead spaced at a distance from the die pad and at least one support bar remnant protruding from the die pad,
a semiconductor power transistor device mounted on the first side of the die pad, the semiconductor power transistor device comprising a first load electrode, a second load electrode and a control electrode, wherein the first load electrode is electrically connected to the die pad, the second load electrode is electrically connected to the load lead and the control electrode is electrically connected to the control lead,
an encapsulation element comprising plastic, the encapsulation element encapsulating at least the semiconductor power transistor device and a portion of the first side of the die pad, wherein at least portions of each of the second side of the die pad, the control lead and the load lead are exposed from the encapsulation element,
wherein at least one support bar remnant is positioned within the encapsulation element and is encapsulated by at least one dielectric compound.

13. A semiconductor component according to claim 12, wherein the creepage distance between the load lead and the die pad is greater than the creepage distance between the load lead and the control lead as a result, at least in part, of the dielectric compound encapsulating the distal end of the support bar remnant.

14. A semiconductor component according to claim 12, wherein the blocking voltage between the die pad and the load lead is at least 1000V as a result, at least in part, of the dielectric compound encapsulating the support bar remnant.

* * * * *